United States Patent
Yi (10) Patent No.: US 9,001,603 B2
(45) Date of Patent: Apr. 7, 2015

(54) DATA VERIFICATION DEVICE AND A SEMICONDUCTOR DEVICE INCLUDING THE SAME

(71) Applicant: SK hynix Inc., Icheon (KR)

(72) Inventor: Jae Ung Yi, Icheon (KR)

(73) Assignee: SK Hynix Inc., Icheon (KR)

( * ) Notice: Subject to any disclaimer, the term of this patent is extended or adjusted under 35 U.S.C. 154(b) by 182 days.

(21) Appl. No.: 13/840,651

(22) Filed: Mar. 15, 2013

(65) Prior Publication Data

US 2014/0063910 A1 Mar. 6, 2014

(30) Foreign Application Priority Data

Aug. 31, 2012 (KR) .......................... 10-2012-0096387

(51) Int. Cl.
| | |
|---|---|
| *G11C 29/02* | (2006.01) |
| *G11C 7/06* | (2006.01) |
| *G11C 13/00* | (2006.01) |
| *G11C 29/08* | (2006.01) |
| *G11C 29/12* | (2006.01) |
| *G11C 7/10* | (2006.01) |

(52) U.S. Cl.
CPC ............ *G11C 7/065* (2013.01); *G11C 13/0021* (2013.01); *G11C 29/026* (2013.01); *G11C 29/08* (2013.01); *G11C 29/1201* (2013.01); *G11C 13/0064* (2013.01); *G11C 7/1006* (2013.01); *G11C 7/1069* (2013.01); *G11C 7/1096* (2013.01)

(58) Field of Classification Search
USPC .................................................. 365/201, 148
See application file for complete search history.

(56) References Cited

U.S. PATENT DOCUMENTS

| | | | |
|---|---|---|---|
| 2008/0002491 A1 * | 1/2008 | Ku et al. ........................ | 365/201 |
| 2008/0052570 A1 | 2/2008 | Kyung | |
| 2010/0023817 A1 * | 1/2010 | Park et al. ..................... | 714/718 |

FOREIGN PATENT DOCUMENTS

| | | |
|---|---|---|
| KR | 10-2008-0006711 A | 1/2008 |
| KR | 10-2008-0019459 A | 3/2008 |

* cited by examiner

*Primary Examiner* — Hoai V Ho
*Assistant Examiner* — Kun Xu (57) ABSTRACT

A semiconductor device includes a data verification device. The data verification device includes a data storage unit for storing data to be input to a memory region in response to a first or second control signal, an input data verifier for deactivating an output of a sense amplifier in response to the first control signal and transmitting the input data stored in the data storage unit to an external pad, and a sense-amplifier verifier for transmitting the input data stored in the data storage unit to the sense amplifier upon in response to the second control signal.

20 Claims, 6 Drawing Sheets

DATA VERIFICATION DEVICE AND A SEMICONDUCTOR DEVICE INCLUDING THE SAME

CROSS-REFERENCE TO RELATED APPLICATION

The priority of Korean patent application No. 10-2012-0096387 filed on Aug. 31, 2012, the disclosure of which is hereby incorporated in its entirety by reference, is claimed.

BACKGROUND OF THE INVENTION

Embodiments of the present invention relate to a data verification device, and more particularly to a data verification device for verifying input data, a data input/output (I/O) path and an operation of a sense amplifier in a test mode.

Generally, when a user desires to input data to a memory device, the data is input to a memory cell array by passing through a data I/O path and a write driver. In verifying the data input to the memory cell array, the data is read out by passing through a sense amplifier and the data I/O path.

However, if, for instance, a new memory device is developed, it may be difficult to guarantee reliability of a data I/O path, a sense amplifier, and/or a memory cell array of the new memory device. In this case, if data is input to the memory device and the input data is then read out from the memory device, a user or a verifier may have difficulty in recognizing whether or not the read-out data is the desired data. That is, to verify the correctness of the data written in the memory device, the reliability of the data I/O path, the sense amplifier, and the memory cell array, which are included in the new memory device, should be guaranteed in advance. However, it takes a long time to verify data written in the memory device using conventional memory verification if the reliability of the data I/O path, the sense amplifier, and the memory cell array has not already been guaranteed.

BRIEF SUMMARY OF THE INVENTION

Embodiments of the present invention are directed to providing a data verification device that substantially obviates one or more problems due to limitations and disadvantages of the related art.

An embodiment of the present invention relates to a data verification device for verifying data to be input to a memory device, a data I/O path, and an operation of the sense amplifier on the condition that the reliability of the data I/O path, the sense amplifier, and a memory cell array have not been guaranteed.

In accordance with one embodiment of the present invention, a data verification device includes: a data storage unit for storing data to be input to a memory region in response to a first or second control signal; an input data verifier for deactivating an output of a sense amplifier upon receiving the first control signal, and transmitting the input data stored in the data storage unit to an external pad; and a sense-amplifier verifier for transmitting the input data stored in the data storage unit to the sense amplifier upon receiving the second control signal.

The data storage unit may include a latch for storing the input data in response to the first or second control signal.

The latch may transmit the stored input data to the input data verifier in response to the first control signal.

The latch may transmit the stored input data to the sense-amplifier verifier in response to the second control signal.

The data storage unit may be coupled to a data input buffer, and may receive the input data through the data input buffer and stores the received data.

The input data verifier and the sense-amplifier verifier may be operated at different time points.

The memory region may include a resistive memory cell.

The first control signal may include a first test mode enable signal (Enable) and a first read signal (Read), the data storage unit may store the input data in response to the first test mode enable signal, and the input data verifier may transmit the stored input data to the external pad in response to the first read signal.

The second control signal may include a second test mode enable signal and a second read signal, the data storage unit may store the input data in response to the second test mode enable signal, and the sense-amplifier verifier may transmit the stored input data to the sense amplifier in response to the second read signal.

In accordance with another embodiment of the present invention, a semiconductor device includes: a core unit configured to include a memory cell array; and a control unit configured to input/read input data to/from the cell array. The control unit may include: a data storage unit for storing data to be input to a memory region in response to a first or second control signal; an input data verifier for deactivating an output of a sense amplifier upon receiving the first control signal, and transmitting the input data stored in the data storage unit to an external pad; and a sense-amplifier verifier for transmitting the input data stored in the data storage unit to the sense amplifier upon receiving the second control signal.

The data storage unit may include a latch for storing the input data in response to the first or second control signal.

The latch may transmit the stored input data to the input data verifier in response to the first control signal.

The latch may transmit the stored input data to the sense-amplifier verifier in response to the second control signal.

The data storage unit may be coupled to a data input buffer, and may receive the input data through the data input buffer and stores the received data.

The input data verifier and the sense-amplifier verifier may be operated at different time points.

The memory region may include a resistive memory cell.

The first control signal may include a first test mode enable signal (Enable) and a first read signal (Read), the data storage unit may store the input data in response to the first test mode enable signal, and the input data verifier may transmit the stored input data to the external pad in response to the first read signal.

The second control signal may include a second test mode enable signal and a second read signal, the data storage unit may store the input data in response to the second test mode enable signal, and the sense-amplifier verifier may transmit the stored input data to the sense amplifier in response to the second read signal.

The input data verifier may include a tri-state buffer coupled to an output of the sense amplifier, the first control signal may be applied to a control input terminal of the tri-state buffer, and the tri-state buffer may be configured to deactivate the output of the sense amplifier in response to the first control signal.

The sense-amplifier verifier may include a tri-state buffer coupled to an output of the data storage unit, the second control signal may be applied to a control input terminal of the tri-state buffer, and the tri-state buffer may transmit the input data stored in the data storage unit to the sense amplifier in response to the second control signal.

In accordance with another embodiment of the present invention, a data verification device includes: a controller for receiving first and second control signals, and generating/outputting a third control signal obtained by a combination of the first and second control signals; a data storage unit for storing data to be input to a memory region upon receiving the third control signal; an input data verifier for deactivating an output of a sense amplifier upon receiving the third control signal, and transmitting the input data stored in the data storage unit to an external pad; and a sense-amplifier verifier for transmitting the input data stored in the data storage unit to the sense amplifier upon receiving the third control signal.

The data storage unit may include a latch for storing the input data in response to the third control signal.

The latch may transmit the stored input data to the input data verifier in response to the third control signal.

The latch may transmit the stored input data to the sense-amplifier verifier in response to the third control signal.

The input data verifier and the sense-amplifier verifier may be operated at different time points.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to embodiments of the present invention, examples of which are illustrated in the accompanying drawings. Wherever possible, the same reference numbers will be used throughout the drawings to refer to the same or like parts. Advantages and characteristics of the present invention and methods for addressing the same will be clearly understood from the following embodiments taken in conjunction with the annexed drawings. However, the present invention is not limited to the embodiments described herein and may be realized in various other forms. The embodiments described herein are only provided to more completely illustrate the present invention and to enable a person having ordinary skill in the art to fully understand the scope of the present invention.

The drawings are not necessarily to scale and in some instances, proportions may have been exaggerated in order to clearly illustrate features of the embodiments. Terms used in the specification are only provided to illustrate the embodiments and should not be construed as limiting the scope and spirit of the present disclosure.

In the embodiment, the term "and/or" used in this specification must be understood to indicate and include all possible combinations of one or more items selected from among listed related items. In the case in which a component is "connected" or "coupled" to another component, the components may be connected or coupled to each other directly or via an interposing component. In an embodiment, a singular expression may include a plural expression unless stated otherwise in the context. In the term "comprises" and/or "comprising" as used herein, the mentioned component, step, operation and/or device is not excluded from presence or addition of one or more other components, steps, operations and/or devices.

Hereinafter, a semiconductor device including a control logic according to an embodiment of the present invention will be described with reference to the accompanying drawings.

Figure 1:
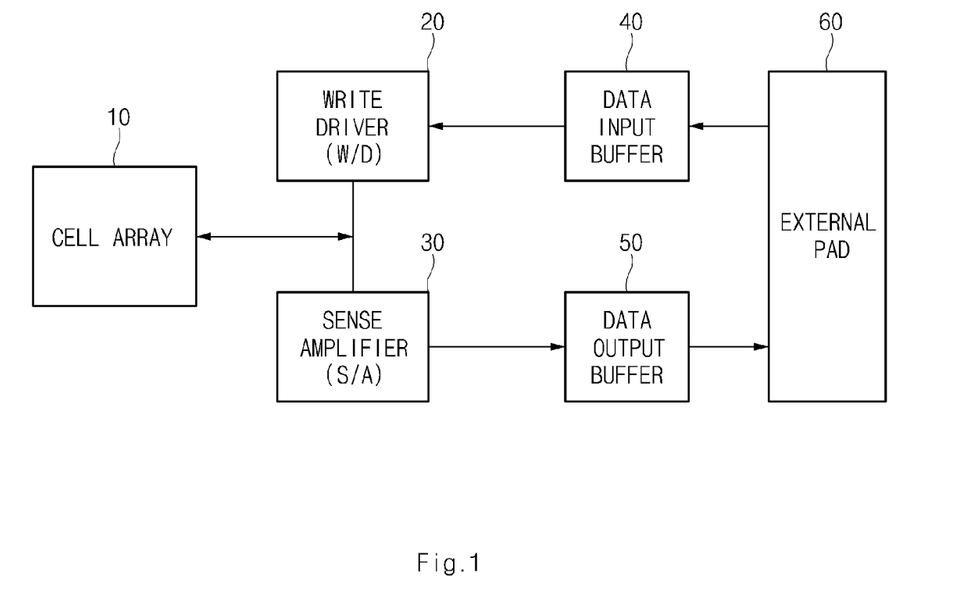
FIG. 1 is a block diagram illustrating a typical memory device.

FIG. 1 is a block diagram illustrating a typical memory device.

Referring to FIG. 1, the memory device includes a cell array 10 and a control logic. The control logic includes a write driver (W/D) 20, a sense amplifier (S/A) 30, a data input buffer 40, a data output buffer 50, and an external pad 60.

In order to verify whether or not target data, which is supposed to be written in the memory device, is correctly written in the cell array 10, the target data is first written or stored in the cell array 10 by sequentially passing through the external pad 60, the data input buffer 40, and the write driver 20. After that, data stored in the cell array 10 is read out from the cell array 10, and the read-out data is transferred to the external pad 60 via the sense amplifier 30 and the data output buffer 50, so that the data can be verified in the external pad 60.

Referring to the aforementioned data transmission paths, in order to verify the data written in the memory device, each of the data I/O path for data transmission, the cell array 10, and the sense amplifier 30 should be verified in advance. That is, reliability thereof must be guaranteed. However, when developing a new memory device, the reliability of a data I/O path, a sense amplifier, and a cell array included in the new memory device may not be guaranteed. Therefore, in order to verify data written in the new memory device using a typical data verification device, the data I/O path, the cell array 10, and the sense amplifier 30 should first be verified, and, therefore, it may take a long time to perform a normal memory verification process.

Figure 2:
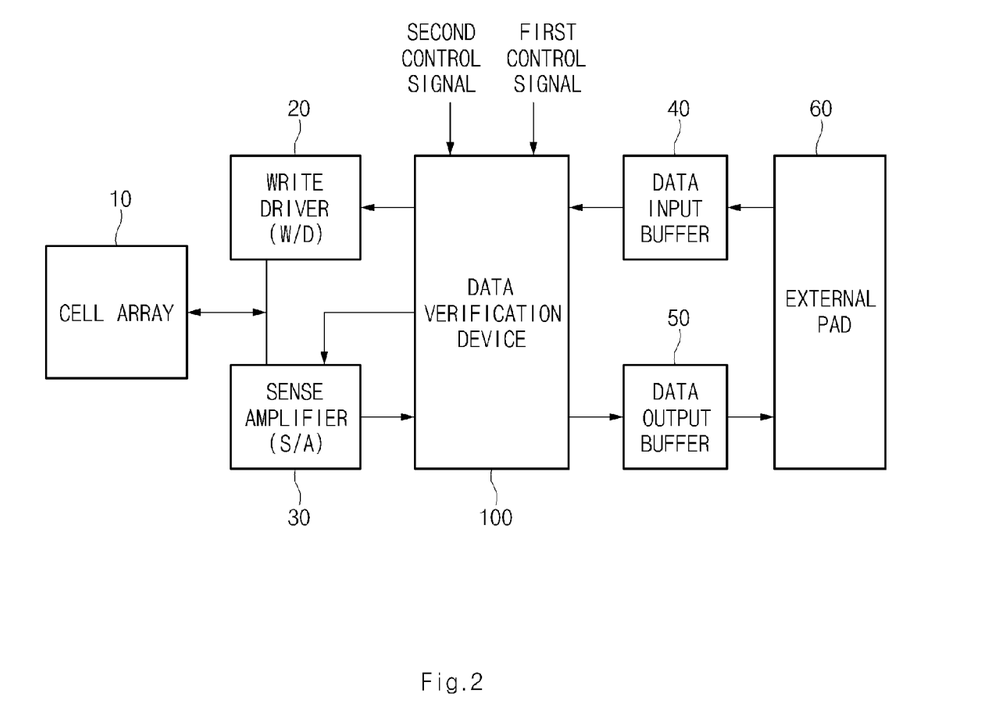
FIG. 2 is a block diagram illustrating a memory device including a data verification device according to an embodiment of the present invention.

FIG. 2 is a block diagram illustrating a memory device including a control logic that has a data verification device according to an embodiment of the present invention. Referring to FIG. 2, the memory device includes a cell array 10 and a control logic. The control logic includes a write driver (W/D) 20, a sense amplifier (S/A) 30, a data input buffer 40, a data output buffer 50, an external pad 60, and a data verification device 100.

In this embodiment, it is assumed that the reliability of a data I/O path, the sense amplifier 30, and the cell array 10 included in the memory device shown in FIG. 2 has not been verified yet.

In a test mode of the memory device, the data verification device 100 receives a first or second control signal, and is coupled to the write driver 20, the sense amplifier 30, the data input buffer 40, and the data output buffer 50. However, in a normal mode, the control logic of the memory device operates in substantially the same manner as in the control logic shown in FIG. 1. That is, in a normal mode, the data verification device 100 transmits input and output data to the write driver 20 and the data output buffer, respectively, without performing any operation therein.

In the test mode, upon receiving the first control signal, the data verification device 100 does not transmit input data received from the data input buffer 40 to the write driver 20. In addition, upon receiving the first control signal, the data verification device 100 deactivates an output signal of the sense amplifier 30, and transmits the input data received from the data input buffer 40 to the external pad 60 through the data output buffer 50. Thus, the external pad 60 can verify the input data and a data I/O path through which the input data passes by checking the data transmitted thereto. Accordingly, the data verification device 100 according to an embodiment can verify target data, which is supposed to be input to the memory device, and a data I/O path, without reading out data from the cell array 10.

In the test mode, upon receiving the second control signal, the data verification device 100 does not transmit the input data received from the data input buffer 40 to the write driver 20, but transmits the input data to the sense amplifier 30. The sense amplifier 30 senses the transmitted data and transmits sensed data to the external pad 60 through the data output buffer 50. The external pad 60 can verify whether or not the sense amplifier 30 operating normally by checking the data transmitted thereto. Therefore, the data verification device 100 according to an embodiment can verify the operation of the sense amplifier 30 without reading out data from the cell array 10.

In accordance with an embodiment, the data verification device may be included in a control logic of a new memory device such as a resistive memory device including a resistive memory cell. Operations of a data I/O path and a sense amplifier of the resistive memory device, and data to be input to the resistive memory device can be verified using the data verification device.

Figure 3:
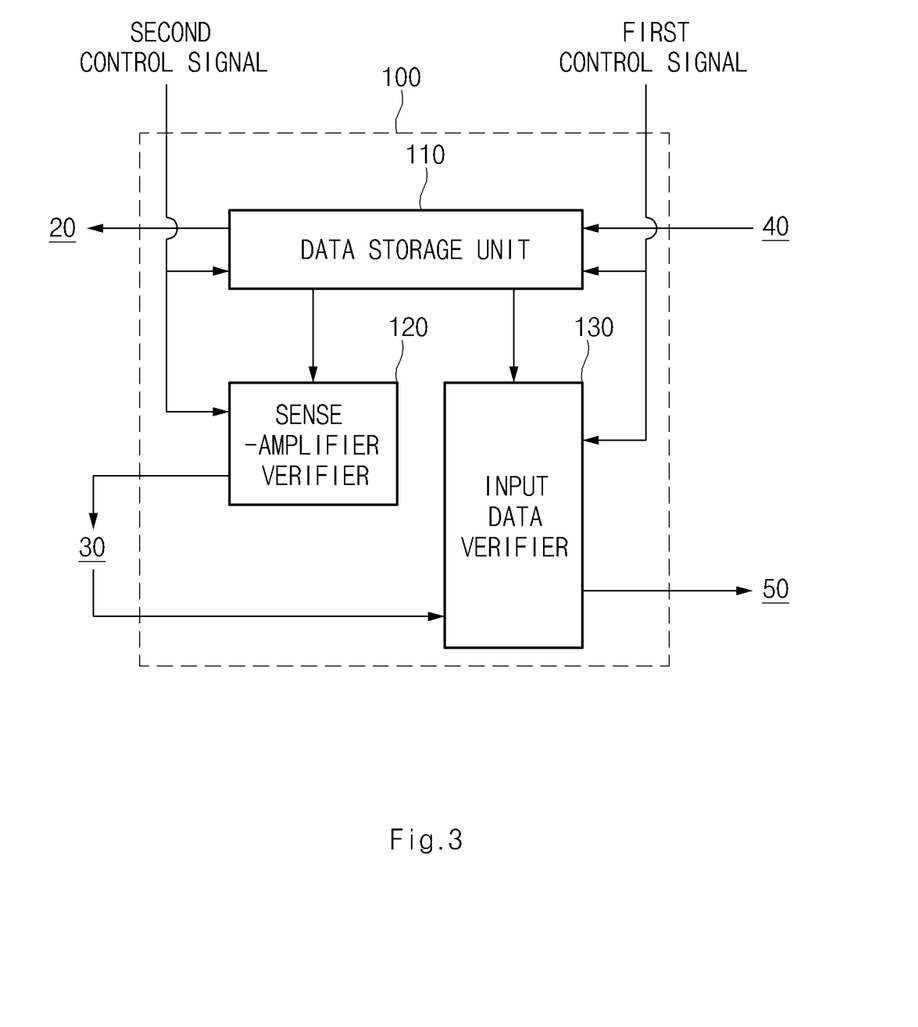
FIG. 3 is a block diagram illustrating a data verification device according to an embodiment of the present invention.

FIG. 3 is a block diagram illustrating a data verification device 100 according to an embodiment of the present invention. Referring to FIG. 3, the data verification device 100 includes a data storage unit 110, a sense-amplifier verifier 120, and an input data verifier 130.

In a test mode, the data storage unit 110 receives a first or second control signal, and receives input data from the data input buffer 40. The data storage unit 110 stores the input data received from the data input buffer 40 in response to the first or second control signal, and transmits the stored data to the input data verifier 130 or the sense-amplifier verifier 120. If neither of the first and second control signals is input to the data storage unit 110, i.e., in a normal mode, the data storage unit 110 does not transmit the input data received from the data input buffer 40 to the input data verifier 130 or the sense-amplifier verifier 120, and, instead, transmits the input data to the write driver 20.

The data storage unit 110 may include a latch. The latch included in the data storage unit 110 stores the input data received from the data input buffer 40 in response to the first or second control signal, and selectively transmits the stored data to the input data verifier 130, the sense-amplifier verifier 120, or the write driver 20 based on the inputting of the first or second control signal.

The sense-amplifier verifier 120 receives the second control signal and the data stored in the data storage unit 110. The sense-amplifier verifier 120 transmits the data received from the data storage unit 110 to the sense amplifier 30 in response to the second control signal. After that, the sense amplifier 30 senses the received data and outputs sensed data to the external pad 60 through the input data verifier 130 and the data output buffer 50. Therefore, an operation of the sense amplifier 30 can be verified by checking the sensed data output through the external pad 60 without reading out data stored in the cell array 10.

The input data verifier 130 receives the first control signal and the data stored in the data storage unit 110. The input data verifier 130 deactivates the output signal of the sense amplifier 30 in response to the first control signal, and transmits the data received from the data storage unit 110 to the external pad 60 through the data output buffer 50. Therefore, the data I/O path and the input data can be verified by checking the data output through the external pad 60 without reading out data stored in the cell array 10.

In accordance with an embodiment, the sense-amplifier verifier 120 and the input data verifier 130 included in the data verification device 100 may operate at different time points. For example, the first and second control signals may be transmitted to the data storage unit 110 at different time points. Accordingly, according to the embodiment, it is possible to perform verification of the input data, verification of the data I/O path, and verification of the sense amplifier 30 independently.

According to an embodiment, the first control signal may include a first test mode enable signal and a first read signal. The data storage unit 110 stores the input data in response to the first test mode enable signal, and transmits the stored data to the input data verifier 130 in response to the first read signal. The input data verifier 130 transmits the data received from the data storage unit 110 to the external pad 60 through the data output buffer 50, after the data is transferred from the data storage unit 110 to the input data verifier 130 in response to the first read signal.

According to an embodiment, the second control signal may include a second test mode enable signal and a second read signal. The data storage unit 110 stores the input data in response to the second test mode enable signal, and transmits the stored data to the sense-amplifier verifier 120 in response to the second read signal. The sense-amplifier verifier 120 transmits the data received from the data storage unit 110 to the sense amplifier 30 in response to the second read signal.

Figure 4:
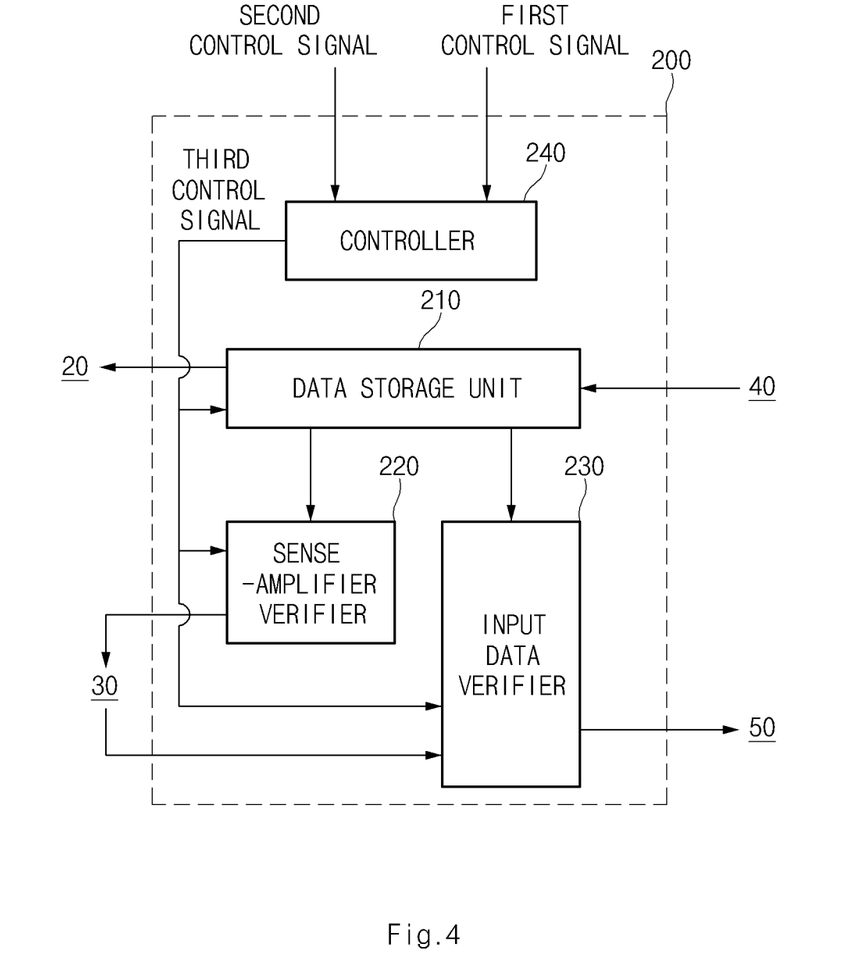
FIG. 4 is a block diagram illustrating a data verification device according to another embodiment of the present invention.

FIG. 4 is a block diagram illustrating a data verification device according to another embodiment of the present invention. Referring to FIG. 4, the data verification device 200 includes a data storage unit 210, a sense-amplifier verifier 220, an input data verifier 230, and a controller 240.

The controller 240 outputs a third control signal based on first and second control signals, such as those described with reference to FIG. 3. The third control signal is generated by combining the first and second control signals. For example, assuming that the first or second control signal includes any of '0' and '1' as a digital signal, a combination of the first and second control signals may be any one of '00', '01', '10', and '11'. Thus, the controller 240 can generate a third control signal having one of the four combinations '00', '01', '10', and '11' to selectively control the data storage unit 210, the sense-amplifier verifier 220, and the input data verifier 230. The aforementioned example is used to describe the memory verification device 200, and thus the first, second, and third control signals are not limited to the aforementioned example.

The data storage unit 210 receives the third control signal, and receives input data from the data input buffer 40. In a test mode, the data storage unit 210 stores the input data from the data input buffer 40 in response to the third control signal, and transmits the stored data to the input data verifier 230 or the sense-amplifier verifier 220 in response to the third control signal. In a normal mode, the data storage unit 210 does not transmit the input data from the data input buffer 40 to the input data verifier 230 and the sense-amplifier verifier 220 in response to the third control signal, and, instead, transmits the received data to the write driver 20.

The data storage unit 210 may include a latch. The latch included in the data storage unit 210 stores the input data from the data input buffer 40 in response to the third control signal, and transmits the stored data to the input data verifier 230, the sense-amplifier verifier 220, or the write driver 20 in response to the third control signal.

In the test mode, the sense-amplifier verifier 220 receives the third control signal, and receives the data stored in the data storage unit 210. The sense-amplifier verifier 220 transmits the data received from the data storage unit 210 to the sense amplifier 30 in response to the third control signal. Thereafter, the sense amplifier 30 senses the data and transmits sensed data to the external pad 60 through the data output buffer 50. Therefore, the proper operation of the sense amplifier 30 can be verified by checking the sensed data output through the external pad 60 without reading out data stored in the cell array 10.

The input data verifier 230 receives the third control signal, and receives the data stored in the data storage unit 210. The input data verifier 230 deactivates the output signal of the sense amplifier 30 in response to the third control signal, and transmits the data received from the data storage unit 210 to the external pad 60 through the data output buffer 50. Therefore, the data I/O path and the input data can be verified by checking the data output through the external pad 60 without reading out data stored in the cell array 10.

The sense-amplifier verifier 220 and the input data verifier 230 included in the data verification device 200 may operate at different time points. Accordingly, according to an embodiment, it is possible to perform verification of the input data, verification of the data I/O path, and verification of the sense amplifier 30 independently from each other, without reading out data from the cell array 10.

Figure 5:
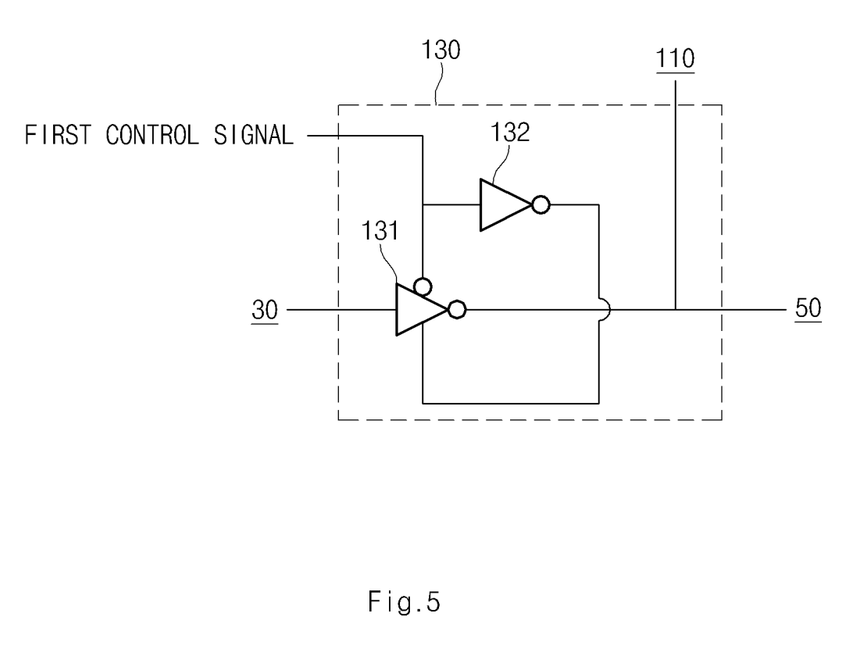
FIG. 5 is a circuit diagram illustrating an input data verifier included in the data verification device shown in FIG. 3.

FIG. 5 is a circuit diagram illustrating the input data verifier 130 included in the data verification device 130 shown in FIG. 3. Referring to FIG. 5, the input data verifier 130 includes a tri-state buffer 131 and an inverter 132.

A data input terminal of the tri-state buffer 131 is coupled to the sense amplifier 30, and a data output terminal is coupled to the data output buffer 50 and the data storage unit 110. The tri-state buffer 131 receives the first control signal through a control input terminal. The tri-state buffer 131 transmits or does not transmit the output signal of the sense amplifier 30 to the external pad 60 through the data output buffer 50 in response to the first control signal. Therefore, in the test mode, the data verification device 100 according to an embodiment can deactivate the output signal of the sense amplifier 30 using the tri-state buffer 131 and the inverter 132 in response to the first control signal. Meanwhile, since the data output terminal of the input data verifier 130 is coupled to the data storage unit 110, if the data stored in the data storage unit 110 is inputted thereto in the test mode in response to the first control signal, the input data verifier 130 transfers the inputted data to the data output buffer 50.

In accordance with an embodiment of the present invention, the input data verifier 230 included in the data verification device 200 in FIG. 4 may have a similar configuration to that of the input data verifier 130 shown in FIG. 5, and a tri-state buffer in the input data verifier 230 may operate similarly in response to the third control signal. Therefore, a detailed configuration and operation of the input data verifier 230 will be omitted.

Figure 6:
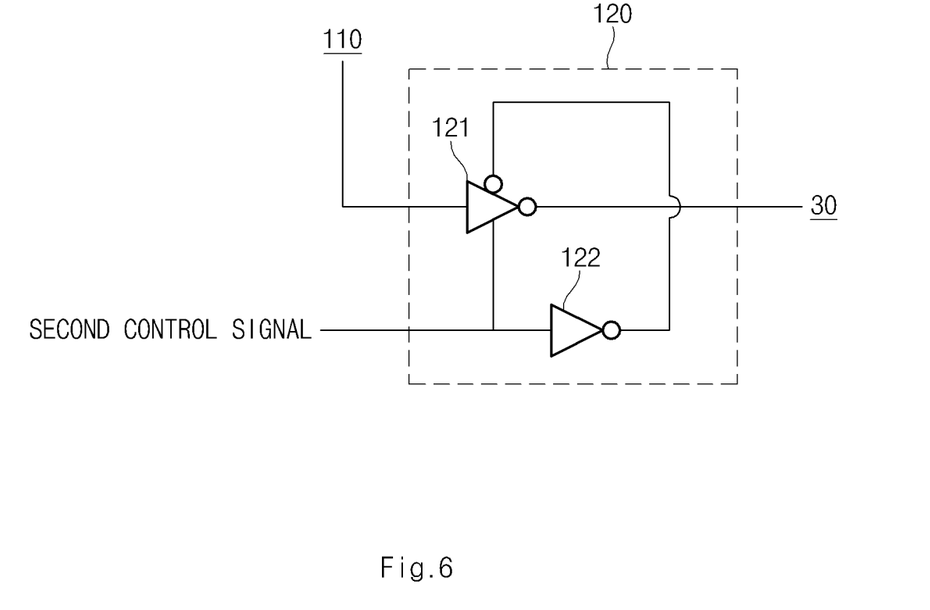
FIG. 6 is a circuit diagram illustrating a sense-amplifier verifier included in the data verification device shown in FIG. 3.

FIG. 6 is a circuit diagram illustrating the sense-amplifier verifier 120 included in the data verification device 100 shown in FIG. 3. Referring to FIG. 6, the sense-amplifier verifier 120 includes a tri-state buffer 121 and an inverter 122.

A data input terminal of the tri-state buffer 121 is coupled to the data storage unit 110, and a data output terminal is coupled to the sense amplifier 30. The tri-state buffer 121 receives the second control signal through a control input terminal. The tri-state buffer 121 transmits, or does not transmit, the data provided from the data storage unit 110 to the sense amplifier 30 in response to the second control signal. The data verification device 100 according to an embodiment transmits the data from the data storage unit 110 to the sense amplifier 30 to verify the operation of the sense amplifier 30.

In accordance with an embodiment of the present invention, the sense-amplifier verifier 220 included in the data verification device 200 in FIG. 4 has a similar configuration to that of the sense-amplifier verifier 120 shown in FIG. 6, and a tri-state buffer in the sense-amplifier verifier 220 operates similarly in response to the third control signal. Therefore, a detailed configuration and operation of the sense-amplifier verifier 220 will be omitted.

A memory device including the data verification device includes a core unit including a cell array, and a control unit for writing/reading data to/from the cell array. The data verification device may be located in the control unit. That is, the data storage unit 110, the input data verifier 130, and the sense-amplifier verifier 120 included in the data verification device 100 may be located in the control unit. As a result, it is possible to increase a degree of integration of the cell array 10 included in the core unit, and one control unit can control a plurality of core units.

As is apparent from the above description, a data verification device according to an embodiment of the present invention can verify data to be input to a memory device, a data I/O path, and an operation of a sense amplifier even if the reliability of the data I/O path, the sense amplifier, and the cell array have not been previously guaranteed.

Those skilled in the art will appreciate that embodiments may be carried out in other specific ways than those set forth herein without departing from the spirit and essential characteristics. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:
1. A data verification device comprising:
a data storage unit configured to store input data in response to a first or second control signal generated in a test mode;

an input data verifier configured to deactivate an output of a sense amplifier in response to the first control signal, and transmit the input data provided by the data storage unit to an external pad; and a sense-amplifier verifier configured to transmit the input data provided by the data storage unit to the sense amplifier in response to the second control signal, wherein the sense amplifier senses the input data transmitted thereto and transmits sensed data to the external pad.

2. The data verification device according to claim 1, wherein the data storage unit includes a latch that stores the input data in response to the first or second control signal.

3. The data verification device according to claim 2, wherein the latch transmits the stored input data to the input data verifier in response to the first control signal.

4. The data verification device according to claim 2, wherein the latch transmits the stored input data to the sense-amplifier verifier in response to the second control signal.

5. The data verification device according to claim 1, wherein the data storage unit is coupled to a data input buffer, and receives the input data through the data input buffer and stores the input data.

6. The data verification device according to claim 1, wherein the input data verifier and the sense-amplifier verifier operate at different time points.

7. The data verification device according to claim 1, wherein the memory region includes a resistive memory cell.

8. The data verification device according to claim 1, wherein:
the first control signal includes a first test mode enable signal and a first read signal,
the data storage unit is configured to store the input data in response to the first test mode enable signal, and
the input data verifier is configured to transmit the stored input data to the external pad in response to the first read signal.

9. The data verification device according to claim 1, wherein:
the second control signal includes a second test mode enable signal and a second read signal,
the data storage unit is configured to store the input data in response to the second test mode enable signal, and
the sense-amplifier verifier is configured to transmit the stored input data to the sense amplifier in response to the second read signal.

10. A data verification device, comprising:
a controller configured to generate a third control signal based on first and second control signals;
a data storage unit configured to store input data in response to the third control signal;
an input data verifier configured to deactivate an output of a sense amplifier in response to the third control signal and transmit the input data stored in the data storage unit to an external pad in a test mode; and
a sense-amplifier verifier configured to transmit the input data stored in the data storage unit to the sense amplifier in response to the third control signal in the test mode, wherein the sense amplifier senses the input data transmitted thereto and transmits sensed data to the external pad.

11. The data verification device according to claim 10, wherein, in a normal mode, the input data verifier is configured to transfer the output of the sense amplifier to a data output buffer.

12. A semiconductor device comprising:
a core unit including a memory cell array; and
a control unit configured to control data reading and writing operations within the semiconductor device,
wherein the control unit includes:
a data storage unit configured to store input data in response to a first or second control signal generated in a test mode;
an input data verifier configured to deactivate an output of a sense amplifier in response to the first control signal, and transmit the input data provided by the data storage unit to an external pad; and
a sense-amplifier verifier configured to transmit the input data provided by the data storage unit to the sense amplifier in response to the second control signal, wherein the sense amplifier senses the input data transmitted thereto and transmits sensed data to the external pad.

13. The semiconductor device according to claim 12, wherein the data storage unit includes a latch that stores the input data in response to the first or second control signal,
wherein the latch transmits the stored input data to the input data verifier in response to the first control signal, and
wherein the latch transmits the stored input data to the sense-amplifier verifier in response to the second control signal.

14. The semiconductor device according to claim 12, wherein the data storage unit is coupled to a data input buffer, and receives the input data through the data input buffer and stores the input data.

15. The semiconductor device according to claim 12, wherein the input data verifier and the sense-amplifier verifier operate at different time points.

16. The semiconductor device according to claim 12, wherein the memory cell array includes a resistive memory cell.

17. The semiconductor device according to claim 12, wherein:
the first control signal includes a first test mode enable signal and a first read signal,
the data storage unit is configured to store the input data in response to the first test mode enable signal, and
the input data verifier is configured to transmit the stored input data to the external pad in response to the first read signal.

18. The semiconductor device according to claim 12, wherein:
the second control signal includes a second test mode enable signal and a second read signal,
the data storage unit is configured to store the input data in response to the second test mode enable signal, and
the sense-amplifier verifier is configured to transmit the stored input data to the sense amplifier in response to the second read signal.

19. The semiconductor device according to claim 12, wherein:
the input data verifier includes a tri-state buffer coupled to the sense amplifier,
the first control signal is applied to a control input terminal of the tri-state buffer, and
the tri-state buffer is configured to deactivate the output of the sense amplifier in response to the first control signal.

20. The semiconductor device according to claim 12, wherein:
the sense-amplifier verifier includes a tri-state buffer coupled to the data storage unit,
the second control signal is applied to a control input terminal of the tri-state buffer, and the tri-state buffer is configured to transmit the input data stored in the data storage unit to the sense amplifier in response to the second control signal.

* * * * *